United States Patent
Sato et al.

(10) Patent No.: US 8,377,814 B2
(45) Date of Patent: Feb. 19, 2013

(54) SEMICONDUCTOR MEMORY DEVICE AND MANUFACTURING METHOD THEREOF

(75) Inventors: Atsuhiro Sato, Tokyo (JP); Hiroyuki Nitta, Yokohama (JP); Fumitaka Arai, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/164,931

(22) Filed: Jun. 21, 2011

(65) Prior Publication Data

US 2011/0250744 A1 Oct. 13, 2011

Related U.S. Application Data

(62) Division of application No. 12/553,496, filed on Sep. 3, 2009, now Pat. No. 7,982,244.

(30) Foreign Application Priority Data

Sep. 4, 2008 (JP) .................................. 2008-227001

(51) Int. Cl.
*H01L 21/28* (2006.01)

(52) U.S. Cl. .................... 438/597; 438/586; 257/E21.19

(58) Field of Classification Search .................. 438/586, 438/597; 257/E21.19
See application file for complete search history.

(56) References Cited

U.S. PATENT DOCUMENTS

| | | | |
|---|---|---|---|
| 6,376,876 B1 | 4/2002 | Shin et al. | |
| 6,943,453 B2 * | 9/2005 | Goda et al. | 257/776 |
| 6,974,979 B2 | 12/2005 | Watanabe et al. | |
| 2005/0218460 A1 | 10/2005 | Hasegawa et al. | |
| 2006/0065913 A1 | 3/2006 | Sakuma et al. | |
| 2007/0002622 A1 | 1/2007 | Matsunaga et al. | |
| 2008/0239799 A1 | 10/2008 | Watanabe | |
| 2008/0293201 A1 | 11/2008 | Goda et al. | |
| 2012/0091510 A1 * | 4/2012 | Taoka et al. | 257/208 |

FOREIGN PATENT DOCUMENTS

| | | |
|---|---|---|
| JP | 2001-203286 | 7/2001 |
| JP | 2003-188252 | 7/2003 |
| JP | 2006-295185 | 10/2006 |
| JP | 2006-351951 | 12/2006 |

OTHER PUBLICATIONS

Office Action mailed on Nov. 20, 2012, in counterpart Japanese Application No. 2008-227001 (3 pages).

* cited by examiner

*Primary Examiner* — Victor A Mandala
(74) *Attorney, Agent, or Firm* — Oblon, Spivak, McClelland, Maier & Neustadt, L.L.P.

(57) ABSTRACT

A semiconductor memory device includes a first block having first memory cells and first select transistors, a second block having second memory cells and second select transistors, and arranged adjacent to the first block in a first direction, the second select transistor being arranged to face the first select transistor and commonly having a diffusion region with the first select transistor, a first interconnection layer provided on the diffusion region between the first and second blocks and extending in a second direction, and a second interconnection layer having a first portion provided in contact with an upper portion of the first interconnection layer and extending to a portion outside the first interconnection layer, and a second portion extending in the second direction and connected to the first portion in a portion outside a portion on the first interconnection layer.

3 Claims, 14 Drawing Sheets

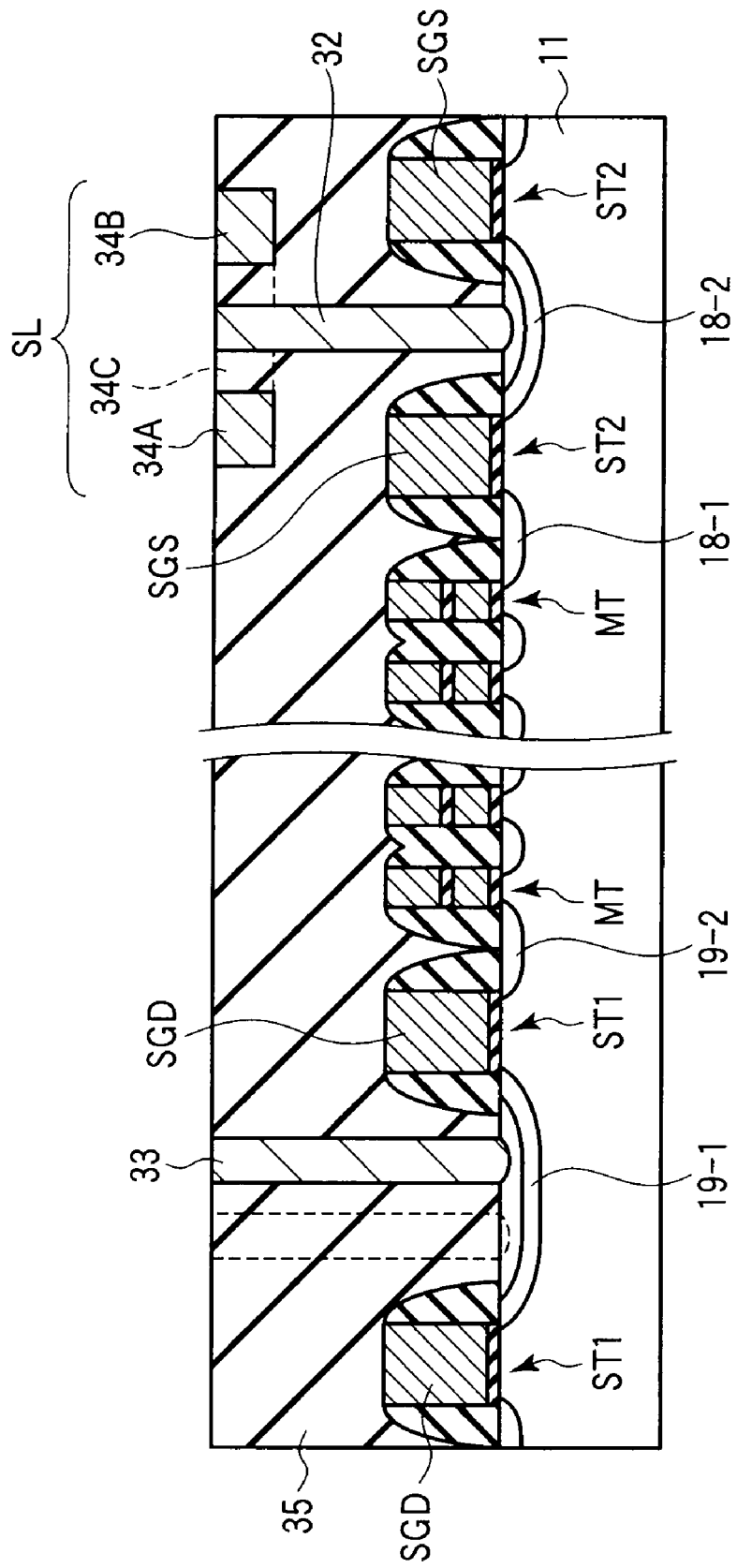
F I G. 16

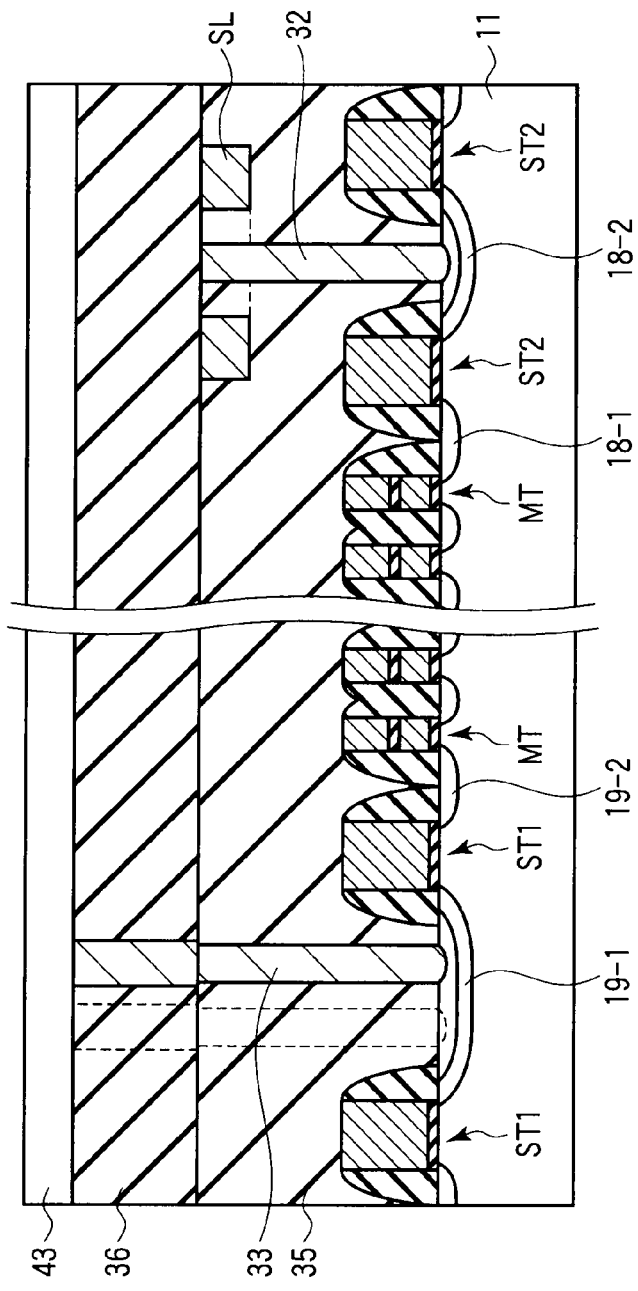
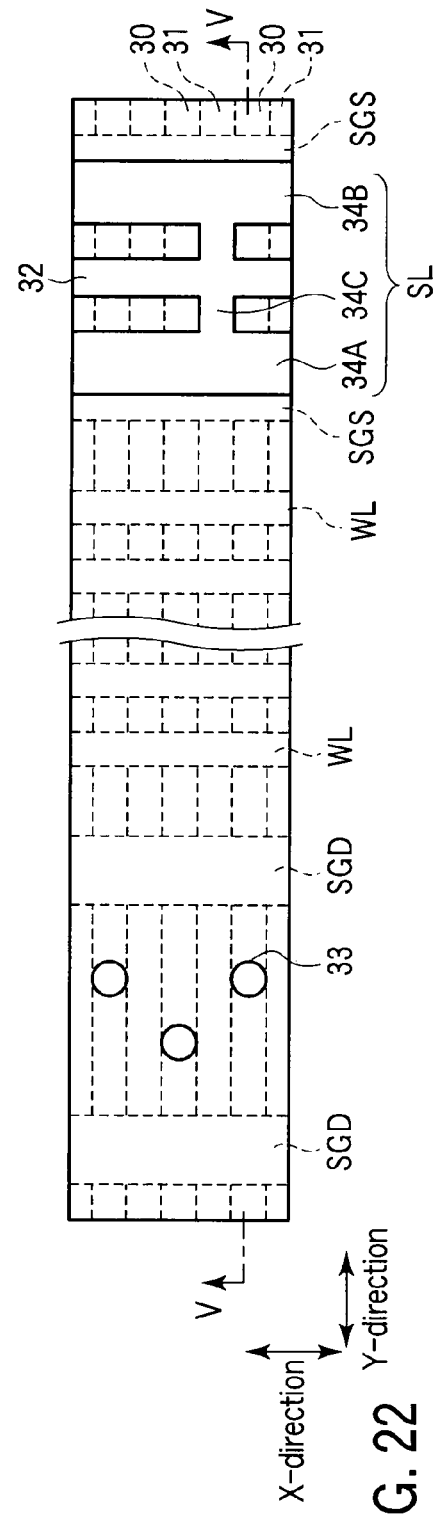
F I G. 21
F I G. 22

SEMICONDUCTOR MEMORY DEVICE AND MANUFACTURING METHOD THEREOF

CROSS-REFERENCE TO RELATED APPLICATIONS

This application is a division of and claims the benefit of priority under 35 U.S.C. §120 from U.S. Ser. No. 12/553,496 filed Sep. 3, 2009, now U.S. Pat. No. 7,982,244, and claims the benefit of priority under 35 U.S.C. §119 from Japanese Patent Application No. 2008-227001 filed Sep. 4, 2008, the entire contents of each of which are incorporated herein by reference.

BACKGROUND OF THE INVENTION

1. Field of the Invention

This invention relates to a semiconductor memory device and a manufacturing method thereof, for example, a buried common interconnection structure used in the semiconductor memory device.

2. Description of the Related Art

As a nonvolatile semiconductor memory, a NAND flash memory that electrically performs data program and erase operations is known. The NAND flash memory has a plurality of units each including a memory cell group configured by a plurality of memory cells that are serially connected along a first direction and source-side and drain-side select transistors that are respectively serially connected to both ends of the current path of the memory cell group. The above units are arranged in a second direction perpendicular to the first direction. The diffusion regions of the select transistors (source-side transistors) are connected to a common source line extending in the second direction. As contacts that connect the diffusion regions of the source-side select transistors to the common source line, contacts using a buried interconnection layer are disclosed in Jpn. Pat. Appln. KOKAI Publication No. 2003-188252 (particularly, FIGS. 41 and 42). Further, the transistors (drain-side transistors) are respectively connected to a plurality of bit lines via bit line contacts.

The buried interconnection layer that connects the source-side select transistors to the common source line is formed in the same step as the formation step of the bit line contacts for simplifying the manufacturing process. Since the buried interconnection layer is formed in a line form extending in the second direction, in the step of forming holes for the bit line contacts in an interlayer insulating layer, etching gas tends to more easily enter in a groove for the buried interconnection layer than holes for the bit line contacts. As a result, the groove for the buried interconnection layer may be formed deeper than the holes for the bit line contacts.

Further, when the buried interconnection layer and bit line contacts are formed by a dual damascene method, the groove for the common source interconnection is formed by etching while the groove for the buried interconnection layer is opened. As a result, the bottom of the buried interconnection layer becomes deeper than that of the diffusion region to thereby increase junction leakage.

BRIEF SUMMARY OF THE INVENTION

According to an aspect of the present invention, there is provided a semiconductor memory device comprising: a semiconductor substrate; a first block having a plurality of first memory cells provided on the semiconductor substrate and a plurality of first select transistors provided on the semiconductor substrate and serially connected to ends of current paths of the first memory cells; a second block having a plurality of second memory cells provided on the semiconductor substrate and a plurality of second select transistors provided on the semiconductor substrate and serially connected to ends of current paths of the second memory cells, the second block being arranged adjacent to the first block in a first direction, one of the second select transistors being arranged to face one of the first select transistors and commonly having a diffusion region with the first select transistor; a first interconnection layer provided on the diffusion region between the first and second blocks and extending in a second direction perpendicular to the first direction; and a second interconnection layer having a first portion provided in contact with an upper portion of the first interconnection layer and extending to a portion outside the first interconnection layer, and a second portion extending in the second direction and connected to the first portion in a portion outside a portion on the first interconnection layer.

According to an aspect of the present invention, there is provided a semiconductor memory device comprising: a semiconductor substrate having a plurality of element regions isolated by element isolation insulating layers and extending in a first direction; a first block having a plurality of first memory cell groups respectively provided on the element regions and each having a plurality of first memory cells serially connected in the first direction, and a plurality of first select transistors respectively provided on the element regions and serially connected to ends of current paths of the first memory cell groups; a second block having a plurality of second memory cell groups respectively provided on the element regions and each having a plurality of second memory cells serially connected in the first direction, and a plurality of second select transistors respectively provided on the element regions and serially connected to ends of current paths of the second memory cell groups, the second block being arranged adjacent to the first block in the first direction, one of the second select transistors being arranged to face one of the first select transistors and commonly having a diffusion region with the first select transistor; a first interconnection layer provided on the diffusion region between the first and second blocks and extending in a second direction perpendicular to the first direction; and a second interconnection layer having a first portion provided in contact with an upper portion of the first interconnection layer and extending to a portion outside the first interconnection layer, and a second portion extending in the second direction and connected to the first portion in a portion outside a portion on the first interconnection layer.

According to an aspect of the present invention, there is provided a manufacturing method of a semiconductor memory device, the method comprising: forming first and second select gate lines extending in a first direction on a semiconductor substrate, the second select gate line being arranged to face the first select gate line; depositing an interlayer insulating layer on an entire surface of the semiconductor substrate; forming a first groove extending in the first direction and reaching the semiconductor substrate in an interlayer insulating layer between the first and second select gate lines; forming a second groove arranged adjacent to the first groove and extending in the first direction in the interlayer insulating layer, and forming a third groove extending in a second direction perpendicular to the first direction between the first and second grooves in the interlayer insulating layer; and filling a conductive material in the first to third grooves.

BRIEF DESCRIPTION OF THE SEVERAL VIEWS OF THE DRAWING

FIG. 16 is a cross-sectional view showing the manufacturing step of the NAND flash memory taken along line V-V of FIG. 15;

FIG. 21 is a cross-sectional view showing the manufacturing step of the NAND flash memory taken along line V-V of FIG. 20;

FIG. 22 is a plan view showing the structure of a NAND flash memory according to a second embodiment of this invention;

DETAILED DESCRIPTION OF THE INVENTION

Figure 1:
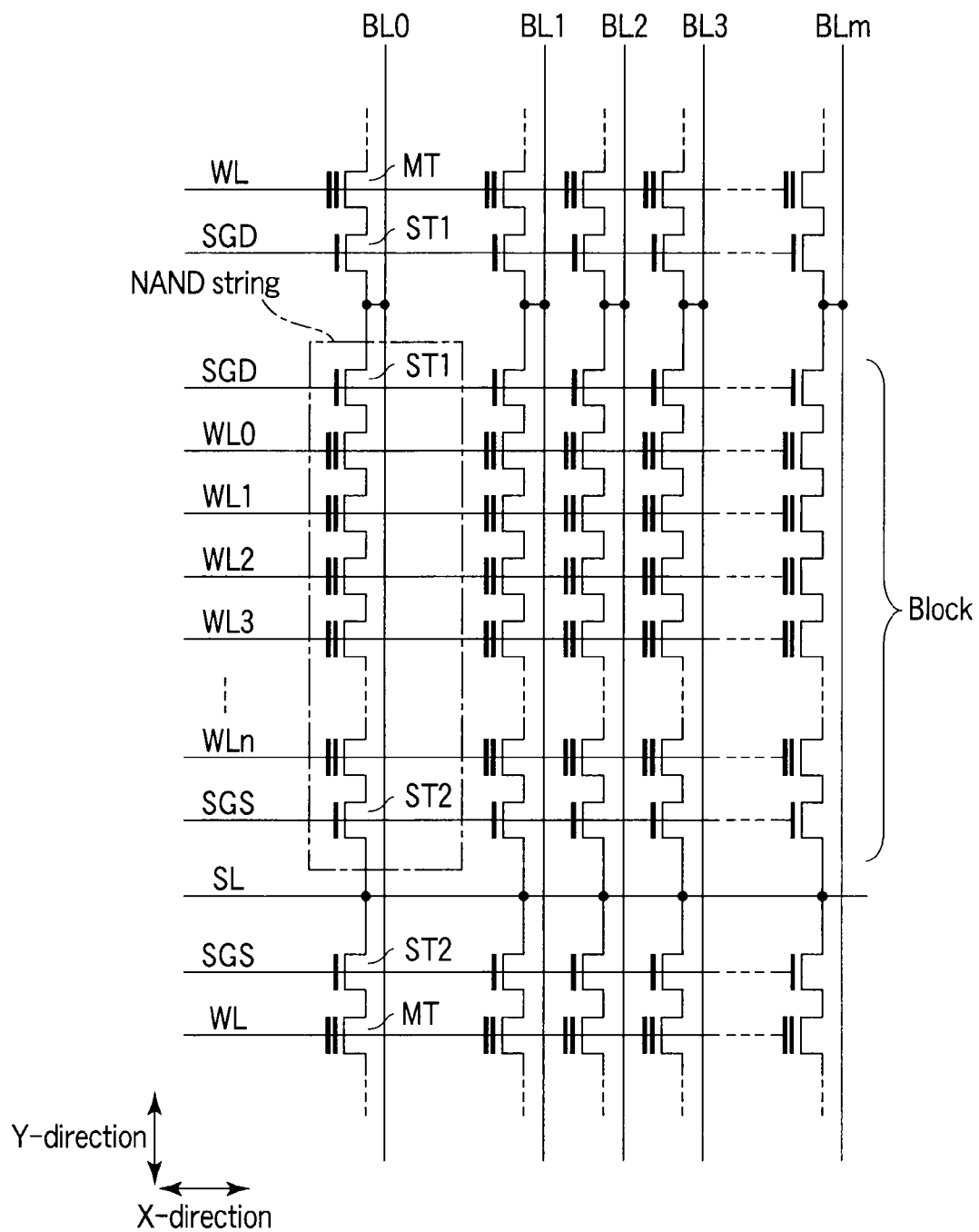
FIG. 1 is a circuit diagram showing the configuration of a NAND flash memory according to a first embodiment of this invention.

The embodiments of the present invention will be described hereinafter with reference to the accompanying drawings. In the description which follows, the same or functionally equivalent elements are denoted by the same reference numerals, to thereby simplify the description.

First Embodiment

FIG. 1 is a circuit diagram showing the configuration of a NAND flash memory according to a first embodiment of this invention. In this embodiment, a case wherein a NAND flash memory is taken as one example of a semiconductor memory device is explained. The NAND flash memory is an electrically rewritable memory that is one type of a nonvolatile semiconductor memory. The NAND flash memory has a plurality of blocks and a data erase operation is performed in the block unit.

Each block has (m+1) NAND strings sequentially arranged in an X-direction. In this case, m indicates an integral number of 0 or more. Each NAND string has select transistors ST1, ST2 and (n+1) memory cell transistors MT. In this case, n indicates an integral number of 0 or more. The select transistors ST1 respectively contained in the (m+1) NAND strings have drains connected to bit lines BL0 to BLm and gates commonly connected to a select gate line SGD. Further, the select transistors ST2 have sources commonly connected to a common source line SL and gates commonly connected to a select gate line SGS.

In each of the NAND strings, the (n+1) memory cell transistors MT are arranged with the respective current paths thereof being serially connected between the source of the select transistor ST1 and the drain of the select transistor ST2. That is, the memory cell transistors MT are serially connected in a Y-direction with every adjacent ones thereof commonly having a diffusion region (source region or drain region).

The control gate electrodes of the memory cell transistors MT are respectively connected to word lines WL0 to WLn in an order from the memory cell transistor MT that lies closest to the drain side. Therefore, the drain of the memory cell transistor MT that is connected to the word line WL0 is connected to the source of the select transistor ST1 and the source of the memory cell transistor MT that is connected to the word line WLn is connected to the drain of the select transistor ST2.

The word lines WL0 to WLn each commonly connect the control gate electrodes of the memory cell transistors MT of the NAND strings in the block. That is, the control gate electrodes of the memory cell transistors MT that lie on the same row in the block are connected to the same word line WL. The (m+1) memory cell transistors MT connected to the same word line WL are treated as one page and data write and read operations are performed for each page.

Further, bit lines BL0 to BLm each commonly connect the drains of the select transistors ST1 of the blocks. That is, the NAND strings that lie on the same column in the blocks are connected to the same bit line.

A desired first block and a second block that lies adjacent to one side of the first block in the Y-direction are arranged with the select transistors ST2 set to face each other. A common source line SL extending in the X-direction is arranged between the first and second blocks. Further, the first block and a third block that lies adjacent to the other side of the first block in the Y-direction are arranged with the select transistors ST1 set to face each other.

Figure 2:
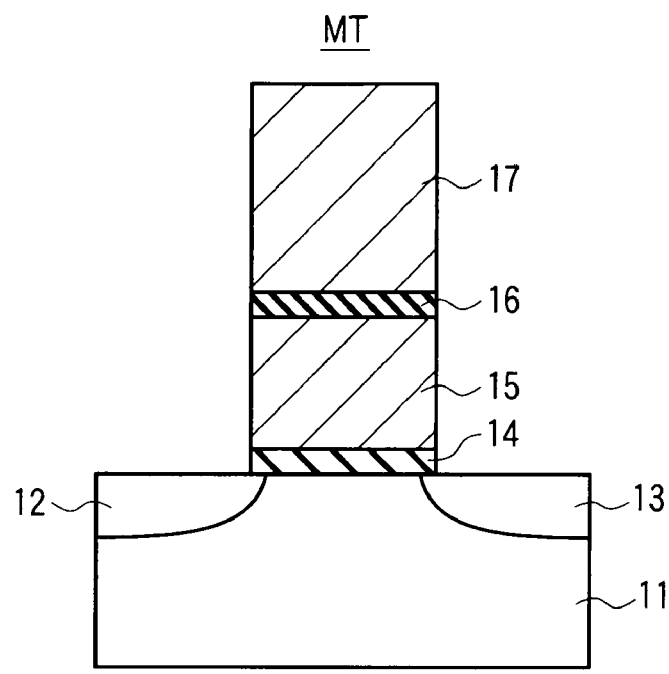
FIG. 2 is a cross-sectional view showing the structure of a memory cell transistor MT.

FIG. 2 is a cross-sectional view showing the structure of the memory cell transistor MT. In a p-type semiconductor substrate 11, two $n^+$-type diffusion regions (source/drain regions) 12 and 13 that are separately formed are provided. The $n^+$-type diffusion regions 12 and 13 are formed by doping n+-type impurity (such as phosphorus (P), arsenic (As) or the like) with high impurity concentration into the p-type semiconductor substrate 11.

On part of the p-type semiconductor substrate 11 that lies between the n+-type diffusion regions 12 and 13, a stacked gate structure containing a charge storage layer (floating gate electrode) and control gate electrode is formed. More specifically, the stacked gate structure is configured by sequentially stacking a tunnel insulating film 14, floating gate electrode 15, intergate insulating film 16 and control gate 17 on the p-type semiconductor substrate 11. The threshold voltage of the memory cell transistor MT varies according to the number of electrons stored in the floating gate electrode 15 and data is stored according to a variation in the threshold voltage.

Figure 3:
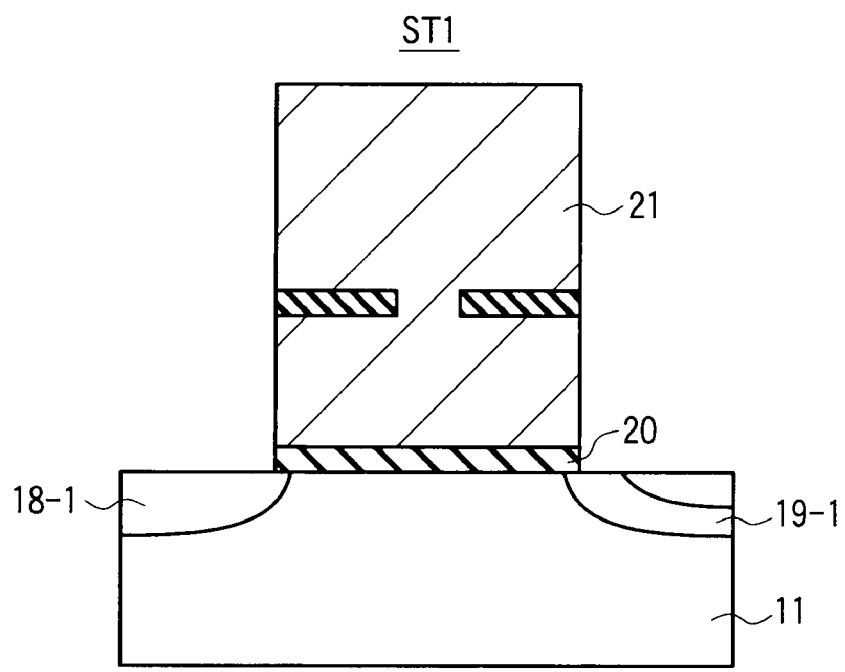
FIG. 3 is a cross-sectional view showing the structure of a select transistor ST1.

FIG. 3 is a cross-sectional view showing the structure of the select transistor ST1. The structure of the select transistor ST2 is the same as that of FIG. 3. The select transistor ST1 is configured by an n-channel MOS transistor.

In the p-type semiconductor substrate 11, two n+-type diffusion regions (source region 18 and drain region 19) that are separately formed are provided. In the following description, the source region and drain region of the select transistor ST1 are represented by 18-1 and 19-1 and the source region and drain region of the select transistor ST2 are represented by 18-2 and 19-2. On part of the p-type semiconductor substrate 11 that lies between the source region 18-1 and the drain region 19-1, a gate electrode 21 is formed. More specifically, the gate electrode 21 is configured by a first electrode formed of the same material as the floating gate electrode 15 and a second electrode formed of the same material as the control gate electrode 17. Further, an insulating film formed of the same material as the intergate insulating film 16 is formed between the first and second electrodes and an opening is formed in the insulating film to electrically connect the first and second electrodes to each other.

The drain region 19-1 of the select transistor ST1 on the side connected to the bit line BL (the source region 18-2 on the side connected to the common source line SL in the case of the select transistor ST2) is formed with the lightly doped drain (LDD) structure formed of two diffusion regions with two different impurity concentrations.

Figure 4:
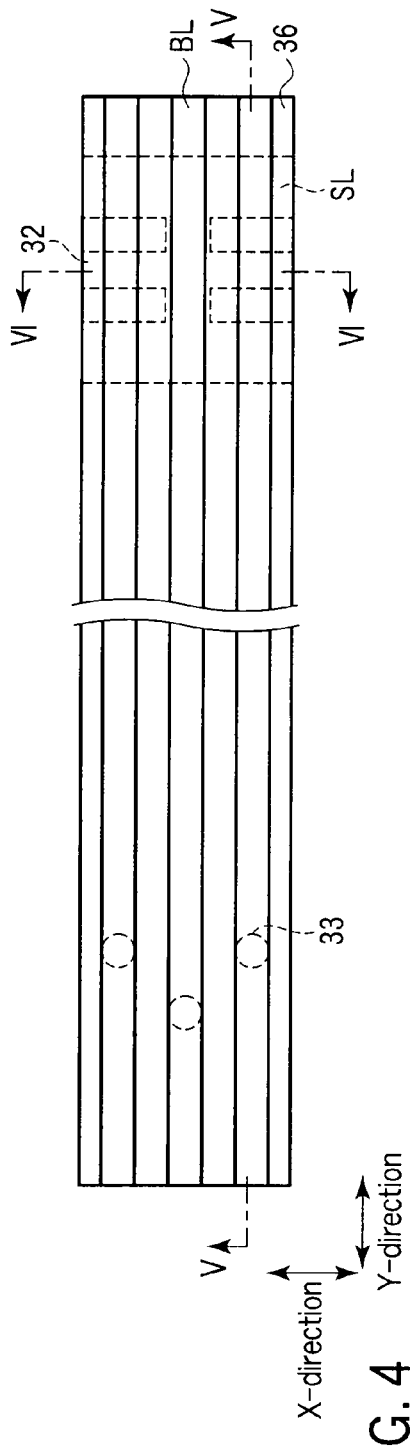
FIG. 4 is a plan view showing the structure of a NAND flash memory.
Figure 5:
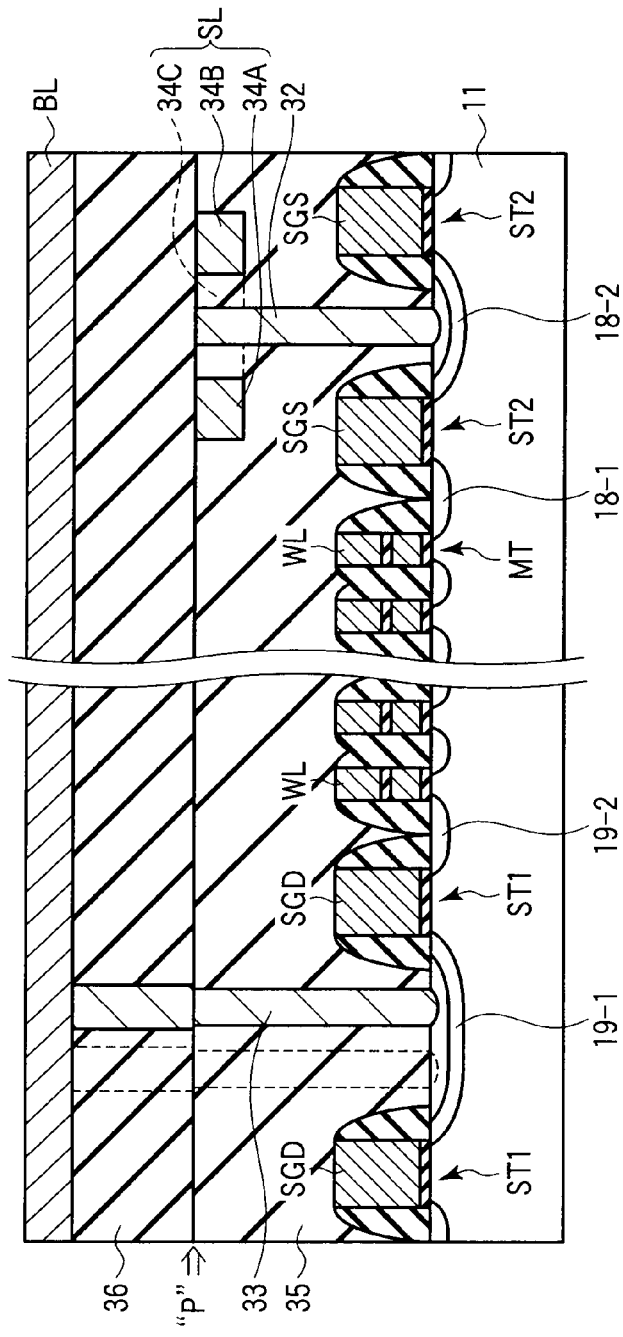
FIG. 5 is a cross-sectional view showing the NAND flash memory taken along line V-V of FIG. 4.
Figure 6:
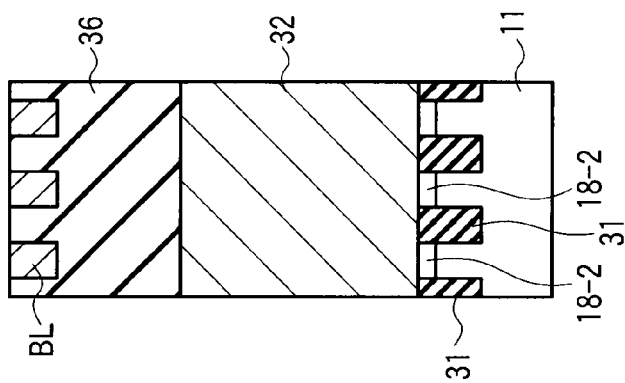
FIG. 6 is a cross-sectional view showing the NAND flash memory taken along line VI-VI of FIG. 4.
Figure 7:
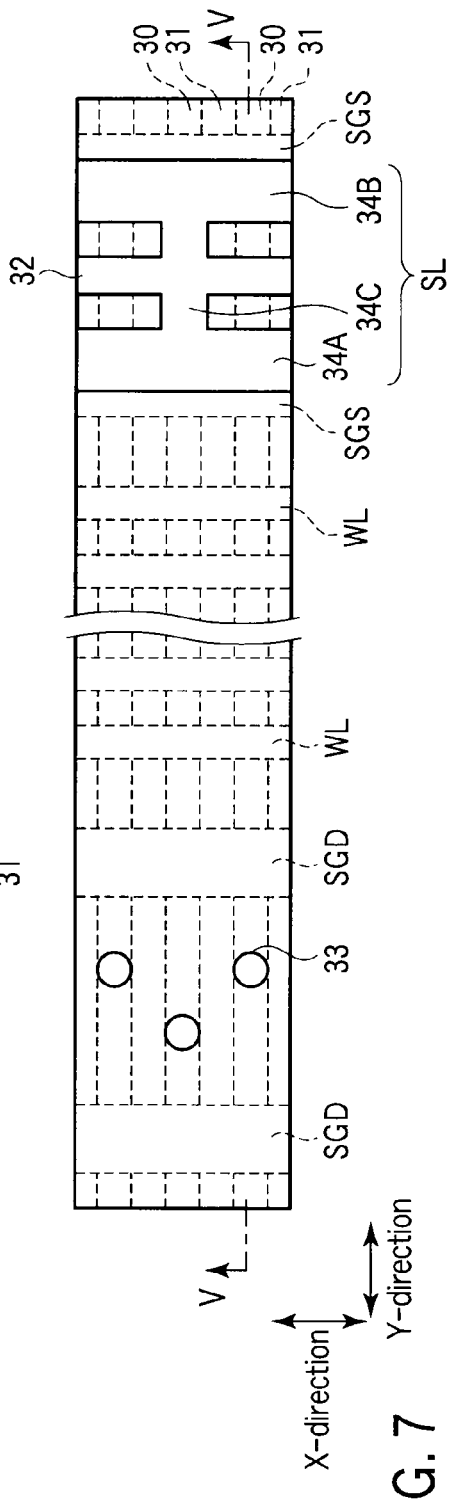
FIG. 7 is a plan view showing the NAND flash memory in a position "P" in FIG. 5.

FIG. 4 is a plan view showing the structure of the NAND flash memory. FIG. 5 is a cross-sectional view showing the NAND flash memory taken along line V-V of FIG. 4. FIG. 6 is a cross-sectional view showing the NAND flash memory taken along line VI-VI of FIG. 4. FIG. 7 is a plan view showing the NAND flash memory in a position "P" in FIG. 5. That is, FIG. 7 is a plan view showing the NAND flash memory in a state in which an interlayer insulating layer on the common source line SL and bit lines BL formed on the interlayer insulating layer are removed. In the plan view, three bit lines BL and element regions (active areas) corresponding to the bit lines are shown for simplicity. The bit lines BL are repeatedly arranged at preset intervals in the Y-direction in the above drawing. Further, in the above plan view, the vertical direction is set to the X-direction and the lateral direction is set to the Y-direction in order to set the plan view in correspondence to the circuit diagram shown in FIG. 1. This is the same in the following plan views.

In the p-type semiconductor substrate 11, a plurality of element isolation insulating layers 31 extending in the Y-direction are formed. Therefore, in the surface area of the p-type semiconductor substrate 11, a plurality of element regions (active areas) 30 electrically isolated from one another by means of the element isolation insulating layers 31 and extending in the Y-direction are formed. For example, the element isolation insulating layer 31 is formed of a shallow trench isolation (STI) structure configured by forming a trench in the p-type semiconductor substrate 11 and filling an insulator formed of silicon oxide, for example.

The word line WL corresponding to the control gate electrode of the memory cell transistor MT extends in the X-direction. Further, the select gate line SGD corresponding to the gate electrode of the select transistor ST1 and the select gate line SGS corresponding to the gate electrode of the select transistor ST2 extend in the X-direction.

In the element region 30, the memory cell transistors MT and select transistors ST1 and ST2 are formed. In the cross-sectional view of FIG. 5, insulating layers formed in the gate electrodes of the select transistors ST1 and ST2 are not shown in the drawing. The memory cell transistor MT is formed in each of intersecting areas between the word lines WL and the element regions 30, the select transistor ST1 is formed in each of intersecting areas between the select gate lines SGD and the element regions 30 and the select transistor ST2 is formed in each of intersecting areas between the select gate lines SGS and the element regions 30. The select transistor ST1, memory cell transistors MT and select transistor ST2 are serially connected to form one NAND string. Further, a plurality of NAND strings are isolated by the element isolation insulating layers 31 and arranged side by side in the X-direction.

As described before, the first and second blocks that are adjacent in the Y-direction are arranged with the select transistors ST2 thereof set to face each other. That is, the two select gate lines SGS contained in the first and second blocks are arranged to face each other. Further, the first and third blocks that are adjacent in the Y-direction are arranged with the select transistors ST1 thereof set to face each other. That is, the two select gate lines SGD contained in the first and third blocks are arranged to face each other.

The select transistors ST2 contained in the first and second blocks share the source region 18-2. Likewise, the select transistors ST1 contained in the first and third blocks share the drain region 19-1.

A buried interconnection layer 32 is provided between the two blocks (between select gate lines SGS) in which the select transistors ST2 are set to face each other. The buried interconnection layer 32 is formed on the source regions 18-2 of the select transistors ST2 arranged side by side in the X-direction and in the interlayer insulating layer 35 and extends in the X-direction. That is, the buried interconnection layer 32 commonly connects the source regions 18-2 of the select transistors ST2 arranged side by side in the X-direction. Further, the buried interconnection layer 32 is formed to extend from the source regions 18-2 to the upper surface of the interlayer insulating layer 35. The plane shape of the buried interconnection layer 32 is rectangular.

A common source line (upper-layer interconnection layer) SL electrically connected to the buried interconnection layer 32 is formed above the select transistors ST2. The common source line SL is formed of three interconnection portions (interconnection portions 34A to 34C). That is, the common source line SL has an "H-shaped" plane form when viewing the interconnection portions 34A, 34B and buried interconnection layer 32. When viewing the interconnection portions 34A to 34C and buried interconnection layer 32, a shape obtained by arranging "H-shaped" forms in parallel is provided.

The interconnection portion 34C is contained in the same layer as a first metal interconnection layer M0 and is electrically connected to the buried interconnection layer 32. The interconnection portion 34C is formed to extend to the exterior of the buried interconnection layer 32 in the Y-direction and is formed above the element regions 30, for example. The width of the interconnection portion 34C is preferably set larger than the width of the buried interconnection layer 32 in order to reduce the resistance.

The interconnection portions 34A and 34B are contained in the same layer as the first metal interconnection layer M0 formed above the p-type semiconductor substrate 11, formed on both sides of the buried interconnection layer 32 and extend in the X-direction. Further, the interconnection portions 34A and 34B are connected to the interconnection portion 34C in a portion outside a portion on the buried interconnection layer 32. The length of the interconnection portions 34A and 34B is set larger than that of the interconnection portion 34C. That is, the interconnection portion 34C extends from the buried interconnection layer 32 and plays a role in connecting with the interconnection portions 34A and 34B arranged outside the buried interconnection layer 32. Further, the width of the interconnection portions 34A and 34B is preferably set larger than the width of the buried interconnection layer 32 and interconnection portion 34C in order to reduce the resistance. As the buried interconnection layer 32 and common source line SL (interconnection portions 34A to 34C), tungsten (W) may be used, for example.

An interlayer insulating layer 36 is formed on the common source line SL. The bit lines BL extending in the X-direction are formed in the interlayer insulating layer 36. That is, the bit lines BL are contained in the same layer as a second metal interconnection layer M1 formed above the first metal interconnection layer M0.

The drain regions 19-1 of the select transistors ST1 arranged side by side in the X-direction are electrically connected to the bit lines BL via a plurality of contacts 33. The contacts 33 are arranged in a zigzag form between two select gate lines SGD. By arranging the contacts 33 in a zigzag form, it becomes possible to reduce the distance between the element regions (active areas) in the X-direction while the contacts 33 are prevented from contacting with each other in the X-direction.

Figure 8:
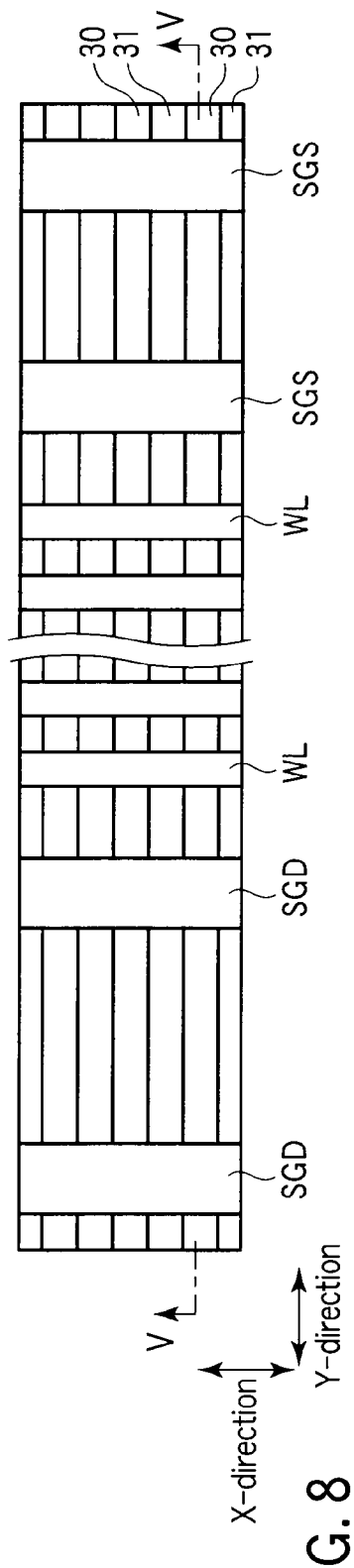
FIG. 8 is a plan view showing the manufacturing step of the NAND flash memory according to the first embodiment.
Figure 9:
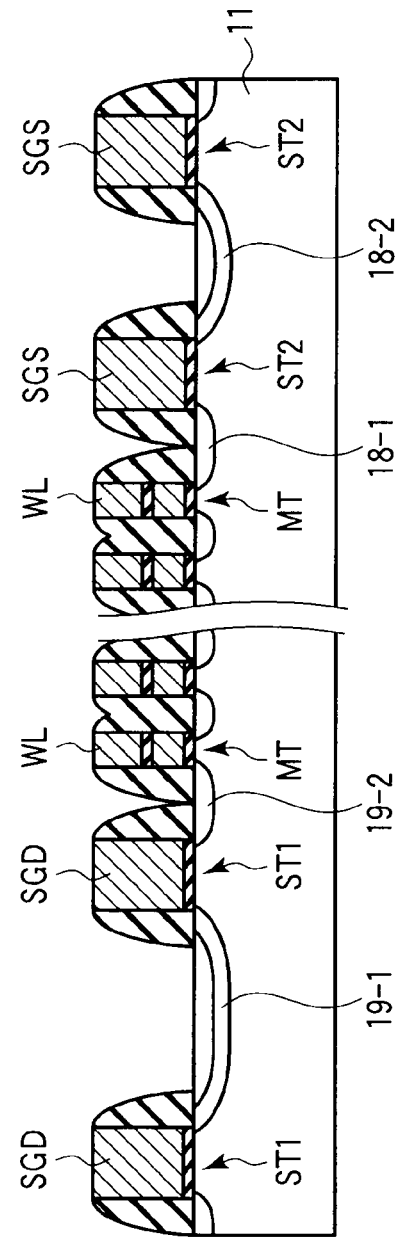
FIG. 9 is a cross-sectional view showing the manufacturing step of the NAND flash memory taken along line V-V of FIG. 8.

Next, one example of the manufacturing method of the NAND flash memory is explained with reference to the accompanying drawings. As shown in FIGS. 8 and 9, a plurality of element isolation insulating layers 31 extending in a Y-direction are formed on a p-type semiconductor substrate 11. Thus, a plurality of element regions (active areas) 30 electrically isolated by the element isolation insulating layers 31 and extending in the Y-direction are formed in the surface area of the p-type semiconductor substrate 11. Then, a select transistor ST1, a plurality of memory cell transistors MT and a select transistor ST2 are formed in each element region 30. The side surfaces of gate electrodes 21 of the select transistors ST1 and ST2 and the stacked gate structures of the memory cell transistors MT are covered with side walls formed of insulating films.

Figure 10:
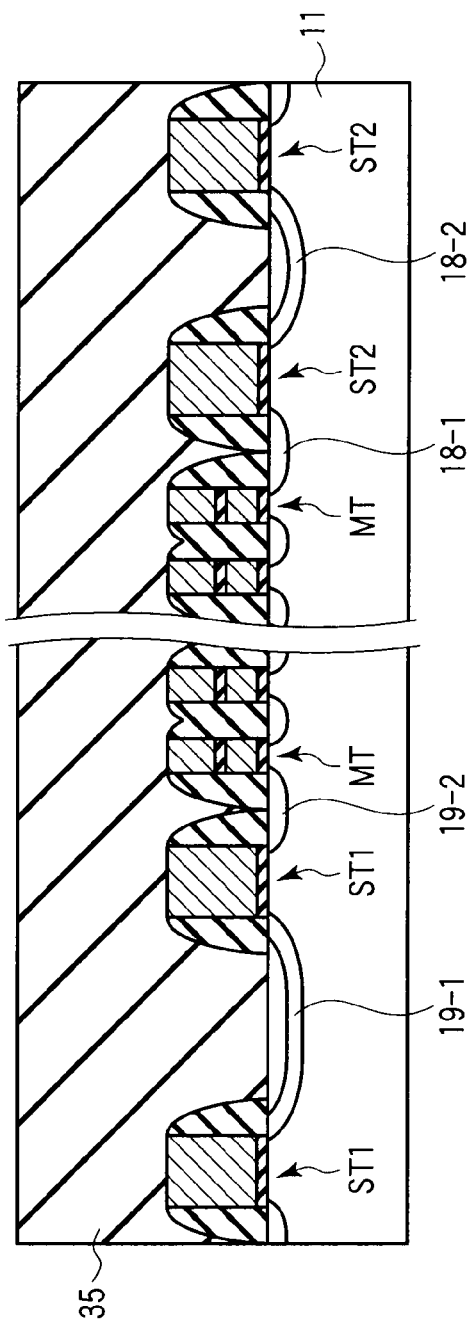
FIG. 10 is a cross-sectional view showing the manufacturing step of the NAND flash memory after the manufacturing step of FIG. 9.
Figure 11:
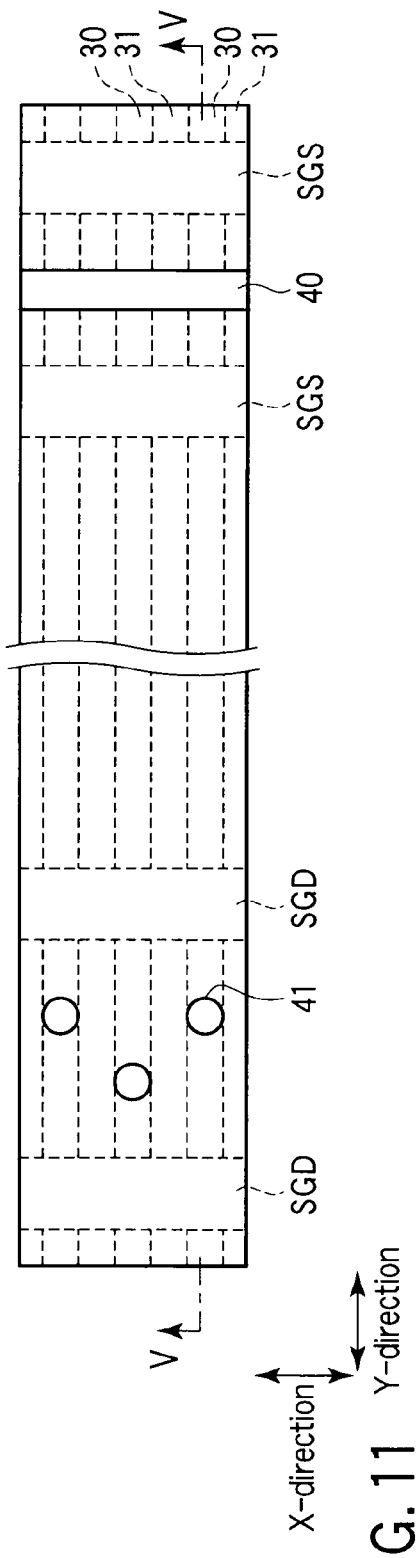
FIG. 11 is a plan view showing the manufacturing step of the NAND flash memory after the manufacturing step of FIG. 10.
Figure 12:
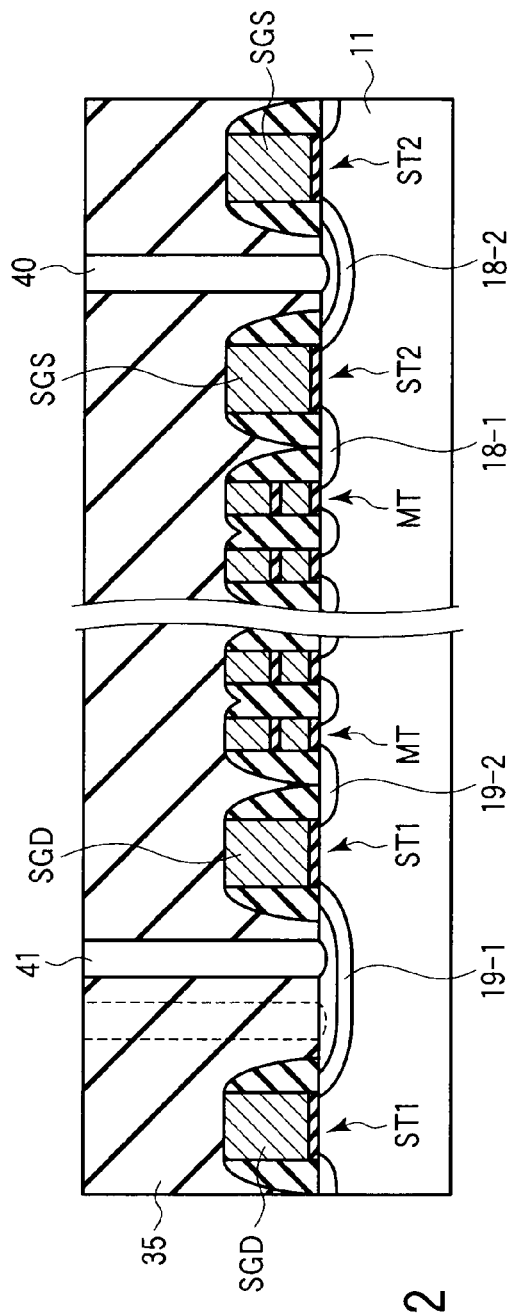
FIG. 12 is a cross-sectional view showing the manufacturing step of the NAND flash memory taken along line V-V of FIG. 11.

As shown in FIG. 10, an interlayer insulating layer 35 is deposited on the entire surface of the p-type semiconductor substrate 11 by a chemical vapor deposition (CVD) method, for example. As shown in FIGS. 11 and 12, a groove 40 is formed in part of the interlayer insulating layer 35 that lies between two select gate lines SGS to extend in an X-direction and reach source regions 18-2 by a lithography method and reactive ion etching (RIE) method, for example.

A plurality of openings 41 are formed in the interlayer insulating layer 35 between two select gate lines SGD to reach a plurality of drain regions 19-1 at the same time as forming step of the groove 40. The openings 41 are arranged in a zigzag form. In the opening forming step, since the groove 40 is formed in a linear form and the area thereof is larger than the area of the opening 41, the source region 18-2 exposed by the groove 40 is etched to a larger extent in comparison with the drain region 19-1 exposed by the opening 41, but the groove 40 will not be formed deeper than a bottom of the source region 18-2.

Figure 13:
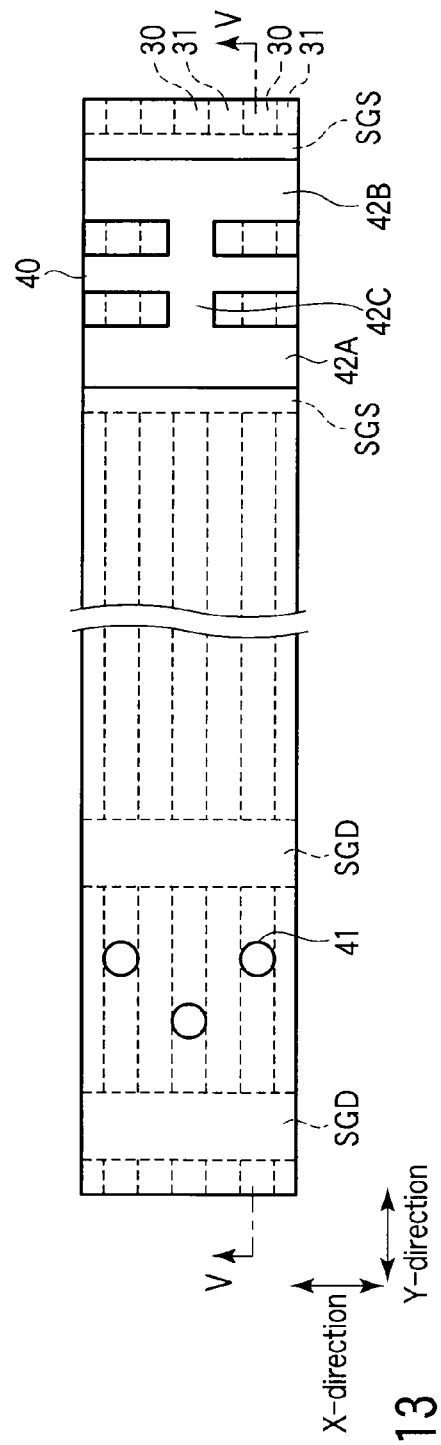
FIG. 13 is a plan view showing the manufacturing step of the NAND flash memory after the manufacturing step of FIG. 11.
Figure 14:
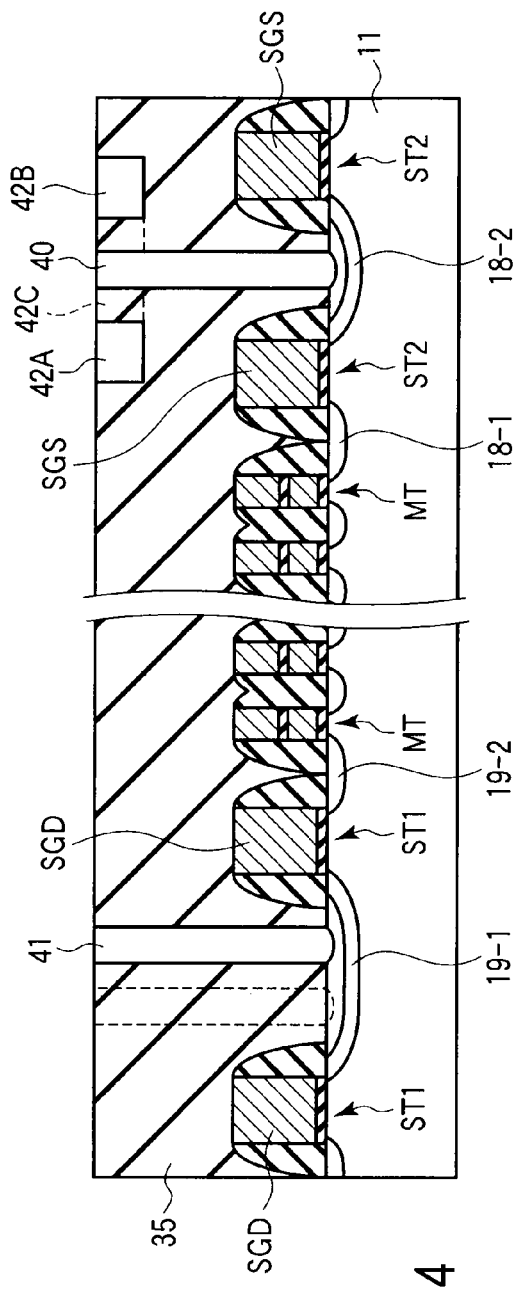
FIG. 14 is a cross-sectional view showing the manufacturing step of the NAND flash memory taken along line V-V of FIG. 13.

As shown in FIGS. 13 and 14, grooves 42A and 42B extending in the X-direction are formed in the interlayer insulating layer 35 on both sides of the groove 40 by the lithography method and RIE method, for example. Further, a groove 42C extending in the Y-direction is formed between the grooves 42A and 42B. In this step, the exposed source region 18-2 is further etched. However, a portion other than the intersecting portion between the groove 40 and the groove 42C is covered with a resist mask or the like. That is, the source region 18-2 that is exposed is not a groove but an opening and it becomes difficult for etching gas to enter in the opening rather than the groove. As a result, the amount of the source region 18-2 to be etched can be reduced.

Figure 15:
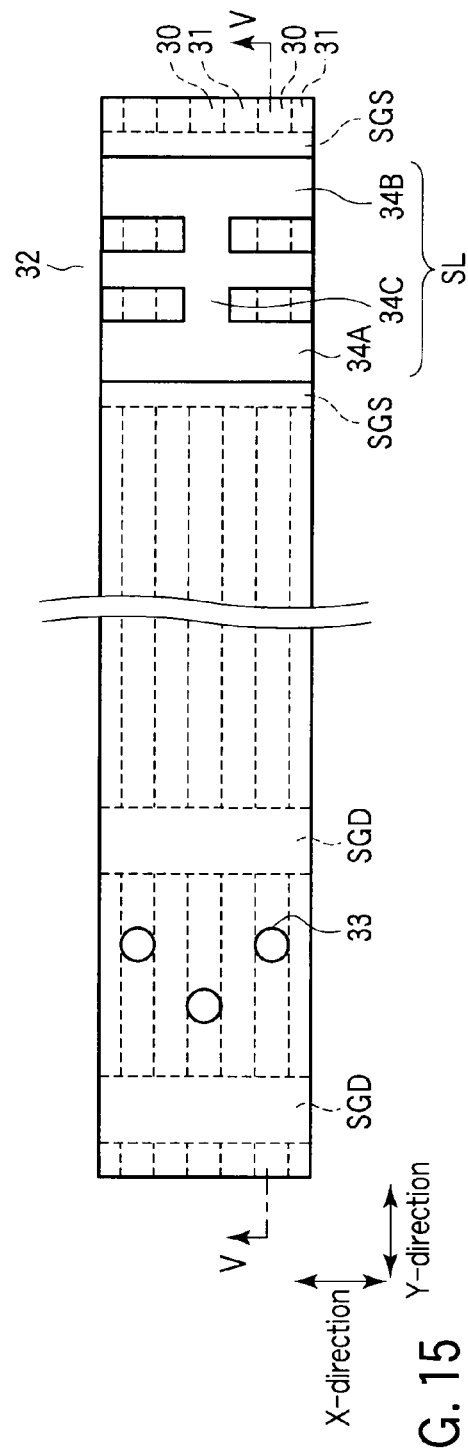
FIG. 15 is a plan view showing the manufacturing step of the NAND flash memory after the manufacturing step of FIG. 13.

As shown in FIGS. 15 and 16, metal such as tungsten (W) is filled into the grooves 40, 42A to 42C by a sputtering method, for example. Thus, a buried interconnection layer 32 electrically connected to the source regions 18-2 and a common source line SL electrically connected to the buried interconnection layer 32 and formed of interconnection portions 34A to 34C are formed in the interlayer insulating layer 35. Further, at the same time as the forming step of the common source line SL, metal such as tungsten (W) is filled into the openings 41 to form a plurality of contacts 33 that are electrically connected to each of a plurality of drain regions 19-1. Then, the upper surface of the interlayer insulating layer 35 is made flat by a chemical mechanical polishing (CMP) method.

Figure 17:
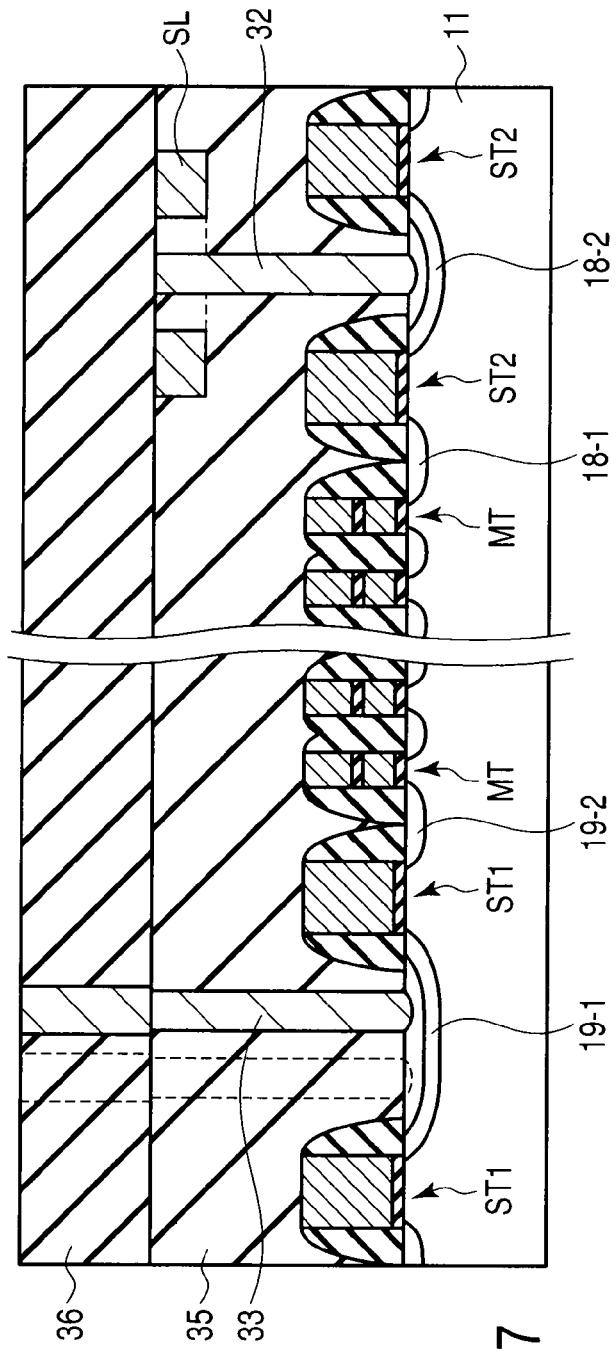
FIG. 17 is a cross-sectional view showing the manufacturing step of the NAND flash memory after the manufacturing step of FIG. 16.
Figure 18:
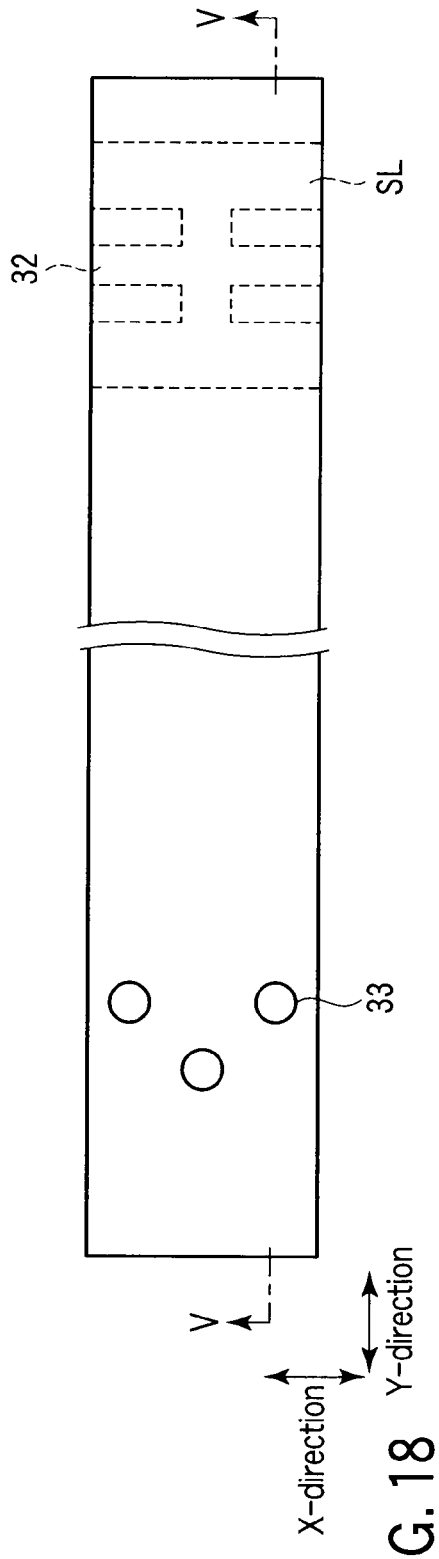
FIG. 18 is a plan view showing the manufacturing step of the NAND flash memory after the manufacturing step of FIG. 17.
Figure 19:
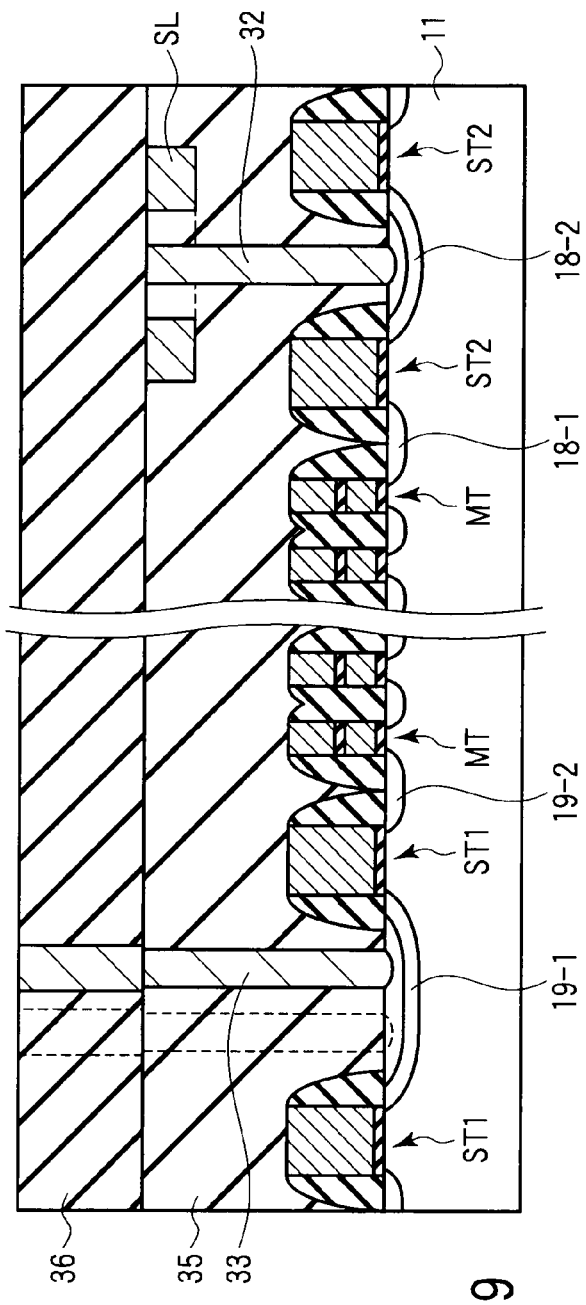
FIG. 19 is a cross-sectional view showing the manufacturing step of the NAND flash memory taken along line V-V of FIG. 18.

As shown in FIG. 17, an interlayer insulating layer 36 is deposited on the interlayer insulating layer 35 by the CVD method, for example. As shown in FIGS. 18 and 19, a plurality of openings that reach the contacts 33 are formed in the interlayer insulating layer 36 by the lithography method and RIE method, for example. Subsequently, metal such as tungsten (W) is filled into the openings so as to cause the contacts 33 to extend to the upper surface of the interlayer insulating layer 36.

Figure 20:
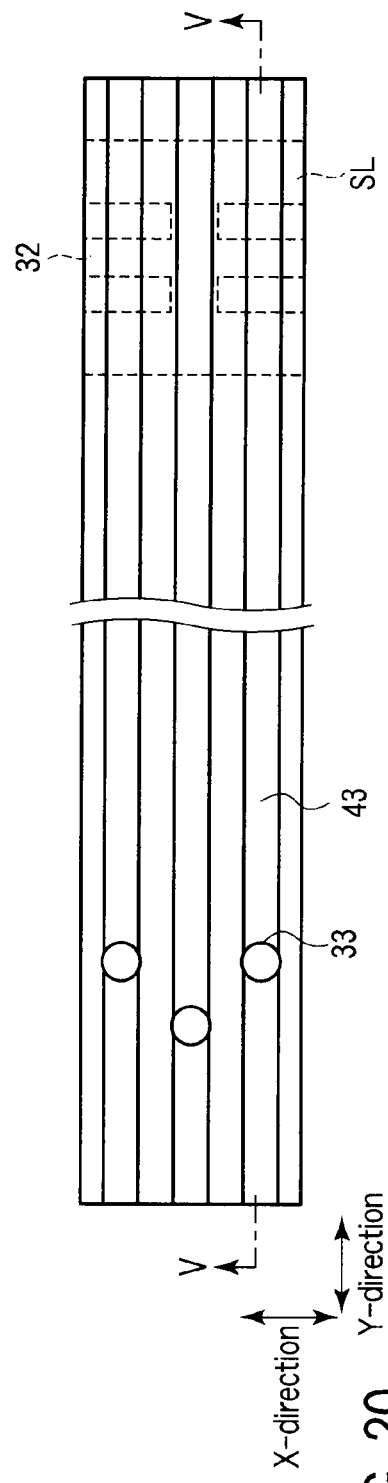
FIG. 20 is a plan view showing the manufacturing step of the NAND flash memory after the manufacturing step of FIG. 18.

As shown in FIGS. 20 and 21, a plurality of grooves 43 extending in the Y-direction are formed on the contacts 33 in the interlayer insulating layer 36 by the lithography method and RIE method, for example.

As shown in FIGS. 4 to 6, metal such as copper (Cu) is filled into the grooves 43 by a metal plating method, for example. Thus, a plurality of bit lines BL electrically connected to the drain regions 19-1 are formed in the interlayer insulating layer 36.

As described above, in the present embodiment, the buried interconnection layer 32 that electrically connects the common source line SL to the source regions 18-2 is provided between the select gate lines SGS. The common source line used as an upper-layer interconnection layer connected to the upper portion of the buried interconnection layer 32 is configured by the interconnection portions 34A and 34B arranged on both sides of the buried interconnection layer 32 and the interconnection portion 34C that electrically connects the buried interconnection layer 32 to the interconnection portions 34A and 34B. Thus, the resistance of the common source line SL can be reduced.

Further, in this embodiment, the interconnection layer formed on the buried interconnection layer 32 is only the intersecting portion between the buried interconnection layer 32 and the interconnection portion 34C. That is, the common source line extending in the X-direction is not formed directly on the buried interconnection layer 32 unlike the conventional case. As a result, in the forming step of the groove of common source line SL in the interlayer insulating layer 35, the amount of the source region 18-2 to be etched can be reduced. That is, the buried interconnection layer 32 can be prevented from penetrating through the source region 18-2 and directly reaching the p-type semiconductor substrate 11. As a result, a leakage current (junction leakage) from the common source line SL to the p-type semiconductor substrate 11 can be reduced.

Second Embodiment

In a second embodiment, an intersecting portion between the interconnection portion 34C and the buried interconnection layer 32 is arranged above the element isolation insulating layer 31.

FIG. 22 is a plan view showing the structure of a NAND flash memory according to the second embodiment of this invention. FIG. 22 is a plan view of the NAND flash memory in the position "P" shown in FIG. 5. The cross-sectional views of the NAND flash memory according to the second embodiment are the same as those of FIGS. 5 and 6.

A common source line (upper-layer interconnection layer) SL electrically connected to the buried interconnection layer 32 is provided above select transistors ST2. The common source line SL is configured by three interconnection portions (interconnection portions 34A to 34C).

The interconnection portion 34C is contained in the same layer as a first metal interconnection layer M0 and electrically connected to the buried interconnection layer 32. The interconnection portion 34C is formed to extend to outside the buried interconnection layer 32 in a Y-direction and is formed above an element region 30, for example. It is preferable to set the width of the interconnection portion 34C larger than that of the buried interconnection layers 32 in order to reduce the resistance.

The interconnection portions 34A and 34B are contained in the same layer as the first metal interconnection layer M0 and formed on both sides of the buried interconnection layer 32 to extend in an X-direction. Further, the interconnection portions 34A and 34B are connected to the interconnection portion 34C in a portion outside the buried interconnection layer 32. The length of the interconnection portions 34A and 34B is set larger than the length of the interconnection portion 34C. That is, the interconnection portion 34C extends from the buried interconnection layer 32 and plays a role in connecting with the interconnection portions 34A and 34B arranged outside the buried interconnection layer 32. Further, it is preferable to set the width of the interconnection portions 34A and 34B larger than the widths of the buried interconnection layers 32 and the interconnection portion 34C in order to reduce the resistance. For example, tungsten (W) is used to form the buried interconnection layer 32 and common source line SL (interconnection portions 34A to 34C).

In this example, it is supposed that the interconnection portion 34C is provided above the element isolation insulating layer 31. That is, the intersecting portion between the buried interconnection layer 32 and the interconnection portion 34C is arranged above the element isolation insulating layer 31. That is, in the steps shown in FIGS. 13 and 14, an exposed portion of the source region 18-2 can be further reduced.

In the NAND flash memory thus configured, in the step of etching the interlayer insulating layer 35 at the time of formation of the common source line SL, the amount of the source region 18-2 to be etched can be more reduced in comparison with the first embodiment. As a result, junction leakage can be effectively reduced.

The manufacturing method of the NAND flash memory according to the second embodiment is the same as that of the first embodiment except that the formation position of the interconnection portion 34C is shifted to a portion above the element isolation insulating layer 31.

Third Embodiment

In a third embodiment, a plurality of interconnection portions 34C are arranged at preset intervals.

Figure 23:
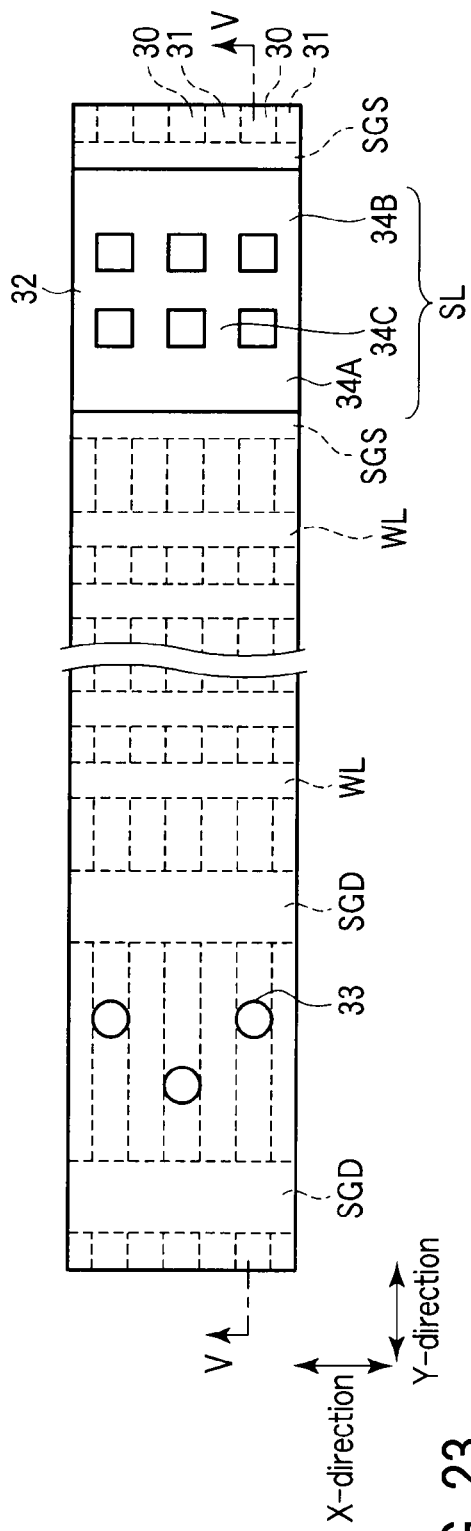
FIG. 23 is a plan view showing the structure of a NAND flash memory according to a third embodiment of this invention.

FIG. 23 is a plan view showing the structure of a NAND flash memory according to the third embodiment of this invention. FIG. 23 is a plan view of the NAND flash memory in the position "P" shown in FIG. 5. The cross-sectional views of the NAND flash memory according to the third embodiment are the same as those of FIGS. 5 and 6.

A common source line (upper-layer interconnection layer) SL electrically connected to the buried interconnection layer 32 is provided above select transistors ST2. The common source line SL is configured by interconnection portions 34A, 34B and a plurality of interconnection portions 34C. That is, the common source line SL is formed with the plane form of a ladder shape.

The interconnection portions 34A and 34B are contained in the same layer as a first metal interconnection layer M0 and formed on both sides of the buried interconnection layer 32 to extend in an X-direction. Further, the interconnection portions 34A and 34B are connected to the interconnection portion 34C in a portion outside the buried interconnection layer 32. The length of the interconnection portions 34A and 34B is larger than the length of the interconnection portion 34C. That is, the interconnection portion 34C extends from the buried interconnection layer 32 and plays a role in connecting with the interconnection portions 34A and 34B arranged outside the buried interconnection layer 32. Further, it is preferable to set the width of the interconnection portions 34A and 34B larger than the widths of the buried interconnection layer 32 and the interconnection portion 34C in order to reduce the resistance. For example, tungsten (W) is used to form the buried interconnection layer 32 and common source line SL (interconnection portions 34A to 34C).

The interconnection portions 34C are contained in the same layer as the first metal interconnection layer M0 and electrically connect the buried interconnection layer 32 to the interconnection portions 34A and 34B. The interconnection portions 34C extend in a Y-direction and are formed above the element isolation insulating layers 31. That is, the intersecting portions between the buried interconnection layers 32 and the interconnection portions 34C are arranged above the element isolation insulating layers 31.

In the NAND flash memory thus configured, junction leakage can be reduced and the resistance of the common source line SL can be reduced.

The manufacturing method of the NAND flash memory according to the third embodiment is the same as that of the first embodiment except that the number of interconnection portions 34C is increased. An example in which the interconnection portion 34C extends in the X-direction is shown, but even if it is formed to extend in an oblique direction as shown in FIG. 24, it is of course possible to attain the same effect as that of the first to third embodiments.

Figure 25:
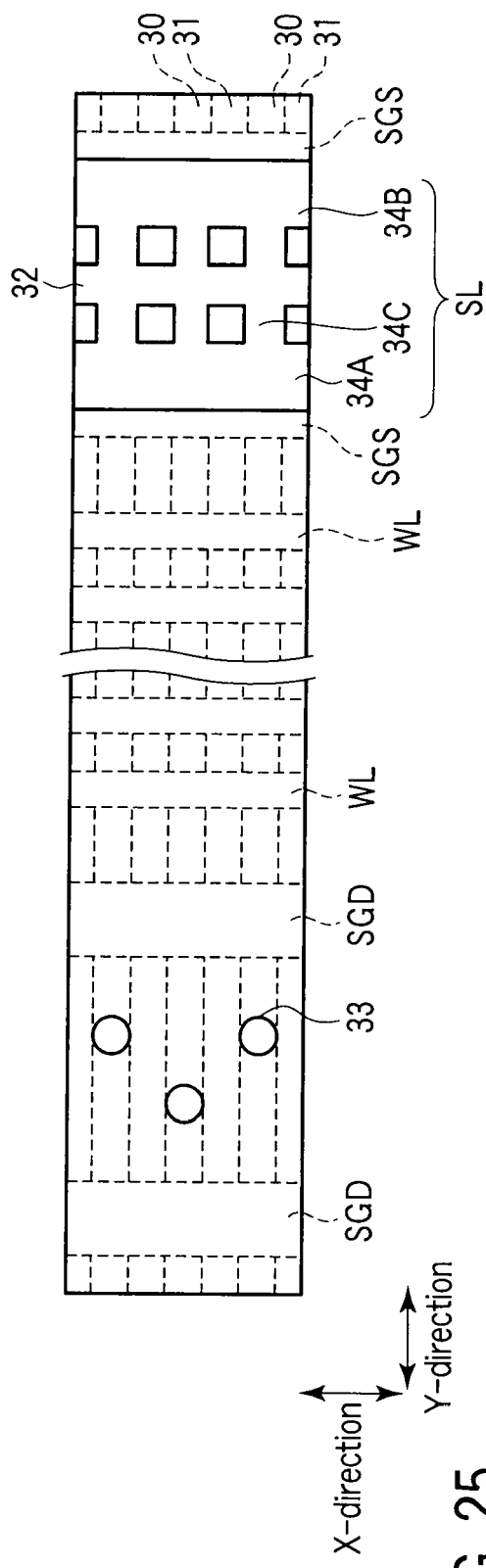
FIG. 25 is a plan view showing the structure of a NAND flash memory according to a modification of third embodiment of this invention.

Further, as shown in FIG. 25, a modification of the third embodiment. Structures of the interconnection portions 34C are same as the third embodiment. A different point is the intersecting portions between the buried interconnection layers 32 and the interconnection portions 34C are arranged above the source region 18-2. Then, it is of course possible to attain the same effect as that of the first embodiment.

Figure 24:
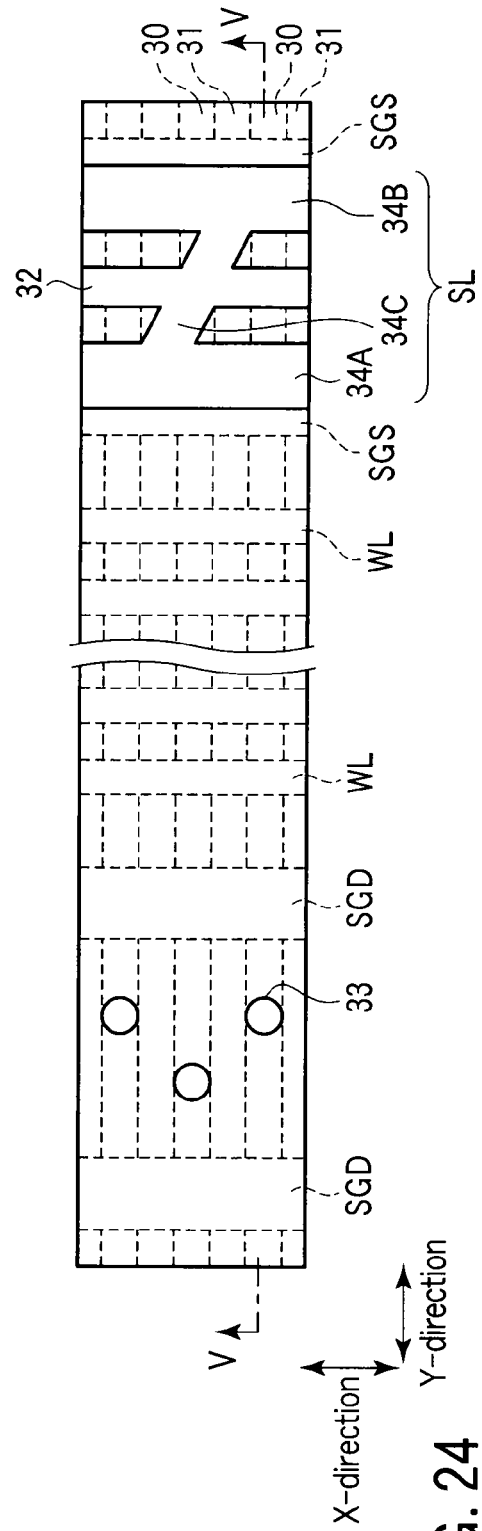
FIG. 24 is a plan view showing another example of the structure of an interconnection portion 34C contained in a common source line SL.

Further, the intersecting portion between the buried interconnection layer 32 and the interconnection portion 34C in FIG. 24 may be formed above the element isolation insulating layers 31, or may be formed above the source region 18-2, or may be formed above a portion between the element isolation insulating layers 31 and the source region 18-2.

Further, in each of the above embodiments, an example in which the NAND flash memory is shown as one type of the memory is explained. However, this invention is not limited to the NAND flash memory and can be applied to another type of memory having a buried interconnection layer that is buried in the interlayer insulating layer and extends in a desired direction. Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A manufacturing method of a semiconductor memory device, the method comprising:
   forming first and second select gate lines extending in a first direction on a semiconductor substrate, the second select gate line being arranged to face the first select gate line;
   depositing an interlayer insulating layer on an entire surface of the semiconductor substrate;
   forming a first groove extending in the first direction and reaching the semiconductor substrate in an interlayer insulating layer between the first and second select gate lines;
   forming a second groove arranged adjacent to the first groove and extending in the first direction in the interlayer insulating layer, and forming a third groove extending in a second direction perpendicular to the first direction between the first and second grooves in the interlayer insulating layer; and
   filling a conductive material in the first to third grooves.

2. The method according to claim 1, further comprising forming a fourth groove arranged adjacent to the first groove on a side of the first interconnection layer opposite to a side on which the second groove is formed and extending in the first direction in the interlayer insulating layer,
   wherein the third groove reaches the fourth groove, and the conductive material is filled in the fourth groove.

3. The method according to claim 1, wherein the third groove includes a plurality of grooves formed at preset intervals.

* * * * *